(12) United States Patent
Bateman

(10) Patent No.: US 11,133,049 B2
(45) Date of Patent: Sep. 28, 2021

(54) 3D MEMORY ARRAY CLUSTERS AND RESULTING MEMORY ARCHITECTURE

(71) Applicant: TC Lab, Inc., Gilroy, CA (US)

(72) Inventor: Bruce L. Bateman, Fremont, CA (US)

(73) Assignee: TC Lab, Inc., Gilroy, CA (US)

( * ) Notice: Subject to any disclaimer, the term of this patent is extended or adjusted under 35 U.S.C. 154(b) by 0 days.

(21) Appl. No.: 16/226,554

(22) Filed: Dec. 19, 2018

(65) Prior Publication Data

US 2019/0392885 A1    Dec. 26, 2019

Related U.S. Application Data

(60) Provisional application No. 62/688,346, filed on Jun. 21, 2018.

(51) Int. Cl.
| | | |
|---|---|---|
| *G11C 11/39* | (2006.01) | |
| *G11C 5/02* | (2006.01) | |
| *G11C 7/06* | (2006.01) | |
| *G11C 7/18* | (2006.01) | |
| *G11C 7/12* | (2006.01) | |
| *G11C 5/06* | (2006.01) | |

(52) U.S. Cl.
CPC .............. *G11C 11/39* (2013.01); *G11C 5/025* (2013.01); *G11C 5/063* (2013.01); *G11C 7/06* (2013.01); *G11C 7/12* (2013.01); *G11C 7/18* (2013.01)

(58) Field of Classification Search
CPC .. G11C 11/39; G11C 7/12; G11C 7/18; G11C 5/063; G11C 7/06; G11C 5/025
See application file for complete search history.

(56) References Cited

U.S. PATENT DOCUMENTS

| | | | |
|---|---|---|---|
| 7,130,238 B1* | 10/2006 | Yu | G11C 5/025 365/230.05 |
| 10,020,043 B2* | 7/2018 | Luan | H01L 29/749 |
| 2002/0081833 A1* | 6/2002 | Li | H01L 21/32135 438/622 |
| 2003/0223270 A1* | 12/2003 | Perlov | B82Y 10/00 365/175 |
| 2007/0047294 A1* | 3/2007 | Panchula | B82Y 25/00 365/158 |
| 2007/0109909 A1* | 5/2007 | Jung | G11C 7/1012 365/233.5 |
| 2009/0296445 A1* | 12/2009 | Shepard | G11C 5/063 365/51 |
| 2010/0271862 A1* | 10/2010 | Yoon | G11C 11/1653 365/148 |
| 2016/0093623 A1* | 3/2016 | Luan | H01L 21/768 257/133 |

(Continued)

*Primary Examiner* — Khamdan N. Alrobaie
(74) *Attorney, Agent, or Firm* — Aka Chan LLP

(57) ABSTRACT

A memory architecture for 3-dimensional thyristor cell arrays is disclosed. Thyristor memory cells are connected in a 3-dimensional cross-point array to form a bit line cluster. The bit line clusters are connected in parallel to sense amplifier and write circuits through multiplexer/demultiplexer circuits. Control circuits select one of the bit line clusters during a read or write operation while the non-selected bit line clusters are not activated to avoid disturbs and power consumption in the non-selected bit line clusters. The bit line clusters, multiplexer/demultiplexer circuits, and sense amplifier and write circuits from a memory array tile (MAT).

16 Claims, 4 Drawing Sheets

(56) References Cited

U.S. PATENT DOCUMENTS

2016/0093624 A1* 3/2016 Luan ................. H01L 21/76224
                                                       257/133
2019/0019546 A1* 1/2019 Luan ................. H01L 29/66363
2019/0042199 A1* 2/2019 Sumbul ................ G11C 7/1006
2019/0326294 A1* 10/2019 Luan ................... H01L 27/1027
2019/0378554 A1* 12/2019 Bateman ............ G11C 13/0061

* cited by examiner

US 11,133,049 B2

3D MEMORY ARRAY CLUSTERS AND RESULTING MEMORY ARCHITECTURE

CROSS-REFERENCE TO RELATED APPLICATIONS

This patent application claims priority from U.S. Provisional Patent Application No. 62/688,346, filed Jun. 21, 2018 and entitled, "3D Memory Array Clusters and Resulting Memory Architecture," which is incorporated herein for all purposes.

BACKGROUND OF THE INVENTION

Random Access Memory (RAM) is a significant computer system element in which data is stored and retrieved. Heretofore DRAMs (Dynamic Random Access Memories) have constituted most of RAMs. DRAMs are integrated circuits which have the most data packing density with a single memory cell formed by a transistor and a capacitor, often termed 1T1C in abbreviated fashion.

But DRAM technology is nearing its end. The shrinkage of current feature dimensions has nearly exhausted the possibilities for effectively shrinking DRAM cells. An emerging technology is thyristor-based memory cell RAMs. At very small dimensions, thyristor memory cell arrays have many advantages over DRAM memory cell arrays, including less power consumption and scalability for further shrinkage. Additionally, thyristor memory cells can be arranged in 3D (three-dimensional) arrays with even better packing densities. U.S. application Ser. No. 15/957,865, filed Apr. 19, 2018, entitled, "Multi-Layer Random Access Memory and Methods of Manufacture," and assigned to the present assignee, which is incorporated by reference herein, discloses one way of creating 3D arrays of thyristor memory cells.

But all integrated circuit memories including RAMs, 2D (two-dimension) or 3D, must be organized in some fashion. That is, the integrated circuit memory is formed by a set of memory cells which are replicated into units, which set is replicated into larger units, and so forth. The present invention is directed toward the efficient and effective organization of 3D thyristor memory cell arrays.

BRIEF SUMMARY OF THE INVENTION

The present invention provides for a memory array tile (MAT) for thyristor memory cells in an integrated circuit. The MAT has a plurality of 3-dimensional thyristor memory cell arrays and each 3-dimensional array has: a plurality of thyristor memory cells arranged in a set of planes, each thyristor memory cell having first and second terminals; a plurality of first conducting lines, each first conducting line connected to the first terminals of the thyristor memory cells in one of the set of planes; a plurality of second conducting lines, each second conducting line connected to a second terminal of a thyristor memory cell in each one of the planes; and a plurality of third conducting lines, each third conducting line controllably connected to a subset of second conducting lines. The MAT also has sense amplifiers and write circuits, and a multiplexer/demultiplexer connected to the first conducting lines of each of the plurality of 3-dimensional thyristor memory cell arrays the multiplexer/demultiplexer selectively connecting the sense amplifiers and write circuits to one of the plurality of 3-dimensional thyristor memory cell arrays during read or write operations so that the thyristor memory cells in the unconnected 3-dimensional thyristor memory cell arrays do not suffer disturb effects and consume little power.

The present invention also provides for an integrated circuit having a memory comprising a plurality of memory array tiles (MATs). Each memory array tile (MATs) further comprises a plurality of 3-dimensional thyristor memory cell arrays and each 3-dimensional array has: a plurality of thyristor memory cells arranged in a set of planes parallel to a surface of the semiconductor substrate, each thyristor memory cell having first and second terminals; a plurality of first conducting lines, each first conducting line connected to the first terminals of the thyristor memory cells in one of the set of planes; a plurality of second (segment) conducting lines, each second conducting line connected to a second terminal of a thyristor memory cell in each one of the planes; and a plurality of third conducting lines, each third conducting line controllably connected to a subset of second conducting lines. The memory array tile (MAT) also has sense amplifiers and write circuits, and a multiplexer/demultiplexer connected to the first conducting lines of each of the plurality of 3-dimensional thyristor memory cell arrays the multiplexer/demultiplexer selectively connecting the sense amplifiers and write circuits to one of the plurality of 3-dimensional thyristor memory cell arrays during read or write operations so that the thyristor memory cells in the unconnected 3-dimensional thyristor memory cell arrays do not suffer disturb effects and consume little power.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
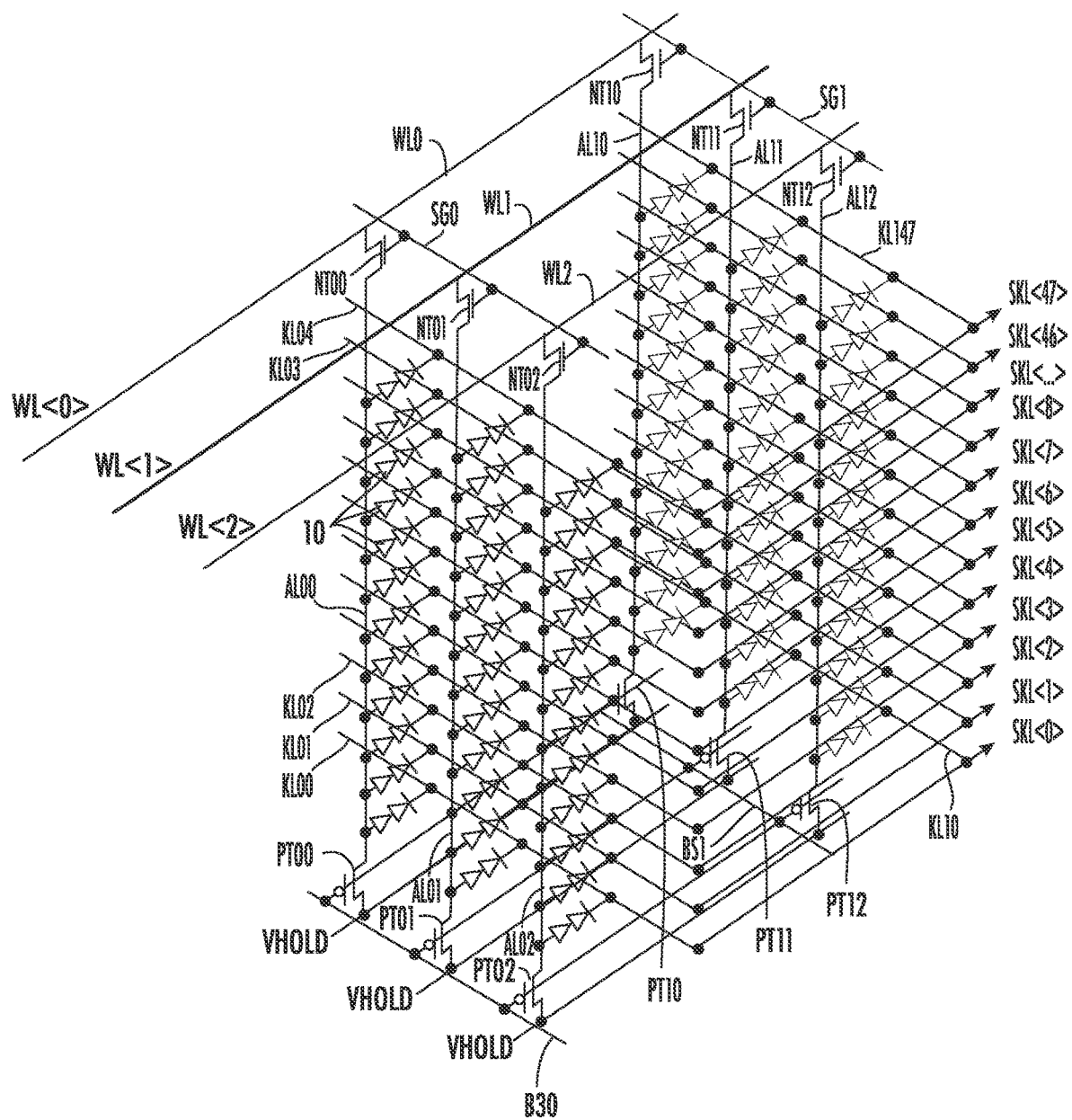
FIG. 1 shows a portion of a 3D thyristor memory cell array.

FIG. 1 shows a perspective view of an example portion of a 3D thyristor memory cell array described in the above-mentioned '865 application. The array portion illustrates how the memory cell array operates and hence the drawing does not necessarily show all of the elements of the array. The array has the conducting lines and memory cells of the array without any intervening structural elements, such as insulating layers, apertures and the like. For a description of these elements and the structure of the memory cells and their array, see the above-mentioned '865 patent application.

The thyristor memory cells 10 of the exemplary array are arranged in 48 layers, each layer stacked over a semiconductor substrate (not shown in the drawing). The memory cells 10 lie in a layer, i.e., the four PNPN regions which form a thyristor memory cell lie within a layer. The anode of each memory cell 10 is connected to an anode line AL which runs perpendicular to the layer of the memory cell and the cathode of each cell is connected to a cathode line KL which runs within the memory cell layer so that the memory cells are connected in a three-dimensional cross-point array. In the exemplary array of FIG. 1, there are 6 anode lines and (48×2) 96 cathode lines. The cathode lines KL of the memory cells 10 in a layer are connected in common to one of the plurality of shared cathode lines SKL0-SKL47.

Three word lines WL0-WL2 run parallel to each other over the memory cell array. Below the memory cell array and parallel to the word lines are three common voltage lines at $V_{HOLD}$. $V_{HOLD}$ is the standby voltage under which a thyristor memory cell 10 retains any stored bit of data.

In the abbreviated array of FIG. 1, the six anode lines AL00-AL02, AL10-AL12 connect the anodes of six sets of memory cells, each set having 48 memory cells in 48 layers. The anode lines AL00 and AL10 are connected to the word line WL0 through an NMOS transistors NT00 and NT10 respectively; the anode lines AL01 and AL11 are connected to the word line WL1 through NMOS transistor NT01 and NT11 respectively; and the anode lines AL02 and AL12 are connected to the word line WL2 through NMOS transistors NT02 and NT12 respectively. The anode lines AL00 and AL10 are also connected to the common voltage line at $V_{HOLD}$ through PMOS transistors PT00 and PT10 respectively; the anode lines AL01 and AL11 are connected to the common voltage line at $V_{HOLD}$ through PMOS transistors PT01 and PT11 respectively; and the anode lines AL02 and AL12 are connected to the common voltage line at $V_{HOLD}$ through PMOS transistors PT02 and PT12 respectively. The gate electrodes of the NMOS transistors NT00, NT01 and NT02 are connected to segment select line SG0 and the gate electrodes of the NMOS transistors NT10, NT11 and NT12 are connected to segment select line SG1.

The gate electrodes of the PMOS transistors PT00, PT01 and PT02 are connected to a control line BS0; and the gate electrodes of the PMOS transistors PT10, PT11 and PT12 are connected to a control line BS1. Perpendicular to the control lines BS there are also lines parallel to the word lines WL which connect the gate electrodes of the PMOS transistors PT aligned in the direction of the word lines. For example, the lines connect gate electrode of PMOS PT00 with the gate electrode of PMOS PT10, the gate electrode of PT01 to the gate of electrode PT11, and so on. These lines with the control lines BS form a two-dimensional interconnected grid under the array of memory cells 10 with the gate electrodes of all the PMOS transistors PT driven by the single signal. The gate electrode signal operates the PMOS transistors PT to turn them on when the array of memory cells 10 is not selected for operation. This ensures that the thyristor memory cells 10 are normally maintained in a standby mode ($V_{HOLD}$) so as not to lose any stored data. When the array of memory cells 10 is selected for operation, the gate electrode signal biases the PMOS transistors weakly on so that the anode lines AL are connected to the $V_{HOLD}$ lines so that the PMOS transistors can be overdriven by the corresponding selected NMOS transistor NT connected to a word line WL. An alternative approach sets the gate electrode signal to turn the PMOS transistors PT off and allow the selection to proceed.

The array of thyristor memory cells 10 can be viewed as being organized as three sets of planes, each set of planes perpendicular to the other set of planes. One set of planes is the plurality of layers of memory cells with each layer including the cathode lines KL connected to the memory cells of the layer and its connected shared cathode line SKL0-SKL47. Another set of planes are the segment planes of which there are two shown in FIG. 1. Each segment plane encompasses a segment select line SG0 (or SG1), the NMOS transistors NT00, NT01, and NT02 (or NT10, NT11, and NT12), the anode lines AL00, AL01 and AL02 (or AL10, AL11 and AL12), and the thyristor memory cells 10 connected to the anode lines AL00, AL01 and AL02 (or the thyristor memory cells 10 connected to the anode lines AL10, AL11 and AL12). The third set of planes is defined by the set of word lines WL with each word line coincident with a plane. In FIG. 1 there are 3 word line planes. The middle plane is coincident with the word line WL1 and contains the NMOS transistors NT01 and NT11, the anode lines AL01 and AL11, and the thyristor memory cells 10 connected to the anode lines AL01 and AL11. Similarly there is a parallel plane for the word line WL0 and a parallel plane for the word line WL2.

While the control lines BS0 and BS1, the PMOS transistors PT00, PT01, PT02, PT10, PT11 and PT12, the lines parallel to the word lines which connect the gate electrodes of aligned PMOS transistors, and the common voltage lines at $V_{HOLD}$ connected to the source regions of the PMOS transistors fall into the various planes described above, they are not considered part of these planes. These elements do not participate in the selection of a memory cell or memory cells in the array, but rather form an underlying network to maintain the data stored in the memory cells of the array in standby. Thus in standby (no cell in the array is selected) all the NMOS transistors are off and all the PMOS transistors are on to keep a $V_{HOLD}$ voltage across each of the memory cells in the array.

When the array and a memory cell in the array is selected, a segment plane is selected by turning on the NMOS transistors NT of the plane by an appropriate voltage on one of the segment select lines SG. The anode lines AL of the segment plane are connected to the word lines WL. But only one of the word lines WL is activated, driving the associated anode line AL to the selected voltage (either read or write voltage). In the example of FIG. 1, the selected word line is WL1 and the segment line SG0 turns on the NMOS transistors NT00, NT01 and NT02. Hence the selected anode line AL01 is driven to a read or write voltage. This selection is indicated by the thickening of the lines for WL1 and AL01 in FIG. 1.

The word lines which are not selected are left at $V_{HOLD}$ level so that their connected anode lines, AL00 and AL02 in this example, are driven to $V_{HOLD}$. The anode lines of the unselected segment planes (the segment plane defined by segment line SG1 in the example of FIG. 1) are kept at a $V_{HOLD}$ level, or left floating during the read or write operation. In the first case, the voltage on the gate electrodes of the PMOS transistors (PT10, PT11 and PT12 in the example) are switched weakly on so that the weakly on and the moderately high impedance PMOS transistors continue to pass the $V_{HOLD}$ voltage of their source regions to their connected anode lines (AL10, AL11 and AL12). Current through the memory cells is very low so that the moderately high impedance of the PMOS transistors is not sufficient to cause a significant voltage drop across these transistors. In the second case, the voltage on the gate electrodes of the PMOS transistors are completely off and the PMOS transistors disconnect the anode lines from the source regions of the transistors at $V_{HOLD}$ to leave the anode lines floating for the short time interval of a read or write operation. The only change in the cathode lines KL due to the read or write operation to the array is a rise in relation to the BL pre-charge voltage and the only conductive direction through a thyristor memory cell is from its anode to cathode. Any rise in cathode voltage with respect to the anode cannot significantly affect the voltage on the anode at the low current levels of the memory cell biased near $V_{HOLD}$. Finally, in a third case, the PMOS transistors can be permanently left weakly on regardless of whether the array (and a memory cell in the array) is selected for a read or write operation. As described earlier, upon selection of the memory cell the NMOS transistor for the anode line AL of the selected memory cell overpowers the weakly PMOS transistor attached between the anode line and a $V_{HOLD}$ line. The anode line AL of the selected memory cell is now connected to the word line of the cell.

Figure 2A:
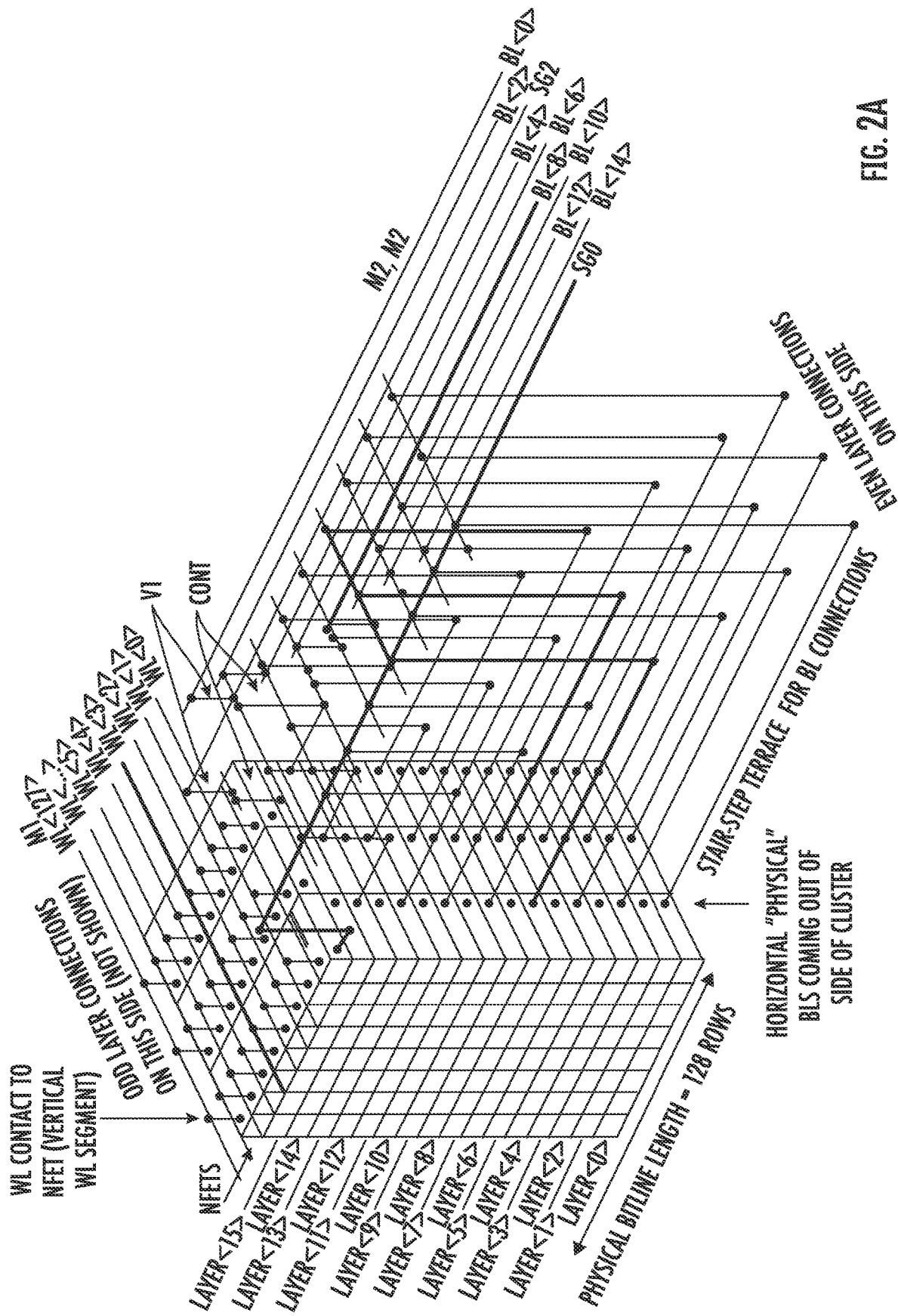
FIG. 2A shows a bit line cluster based upon the FIG. 1 array according to an embodiment of the present invention.

The 3D circuit array portion of FIG. 1 can be considered part of a bit line cluster, a minimum array building block around which a thyristor memory cell RAM might be organized. Selection of the memory cell array can be considered selection of a bit line cluster. FIG. 2A shows a half of a bit line cluster according to the present invention. The bit line cluster is based upon the FIG. 1 3D array portion and has the same orientation as the FIG. 1 array. The bit cluster has 3 segments, 16 layers and 128 word lines in this example. One-half of the bit lines BL at the top of the array extend in the same direction as the cathode lines in the even-numbered layers of the array. Hence the bit lines in FIG. 2A are numbered, BL0, BL2, BL4 . . . , BL14. The other half of the bit lines for the odd-numbered layers extend in the opposite direction. Furthermore the FIG. 1 bit lines BLs are connected to the cathode lines KL in a stair step arrangement, the construction of which is beyond the scope of this invention. See FIG. 7 and the associated text in the '865 application mentioned above. In the bit line cluster of FIG. 2A the shared cathode lines SKLs of FIG. 1 provide the connection to all the cathode lines of a layer. The bit lines BLs at the top of the array are connected to the shared cathode lines SKLs of the corresponding layers.

The exemplary bit line cluster of FIG. 2A has 3 segments, 16 layers and 128 word lines. The segments or segment planes define the width for the wire tracks which run over the top of the bit line cluster. These wire tracks are at metal line 2, or M2 level. The semiconductor technology of the '895 application has a 100 nm metal line pitch so that the 3 segment planes provide space for 12 metal lines, enough space for the 10 M2 wire tracks required for the bit line cluster. Only 10 tracks are required: 8 for the even- (or odd-) numbered bit lines and 2 tracks for the even- (or odd-) numbered segment select lines. Each bit line is connected to 128 (128 word lines)×3 (3 segments)=384 cells. There are 16 layers and a bit line for each layer. Hence each layer provides a bit for a 16-bit I/O (Input/Output) word. Total size of the FIG. 2A bit line cluster is 128×3×16=6 Kb.

As stated above, the FIG. 2A bit line cluster is an example of a minimum array building block. Different factors must be considered for an optimum bit line cluster as part of a memory architecture for the entire memory. One factor is that the cluster volume, the number of bits, and the bit line length (the number of cells) which increases quadratically with the number of layers. The increase in layers requires more wiring tracks (M2 in the described technology) to connect the bit lines. Increasing the M2 tracks adds more segment planes to provide space for the additional tracks. But longer shared cathode lines SKLs and more cells connected to the bit lines adds more capacitance. Speed in reading cells is slowed and there is more cell leakage in the non-selected cells.

Figure 2B:
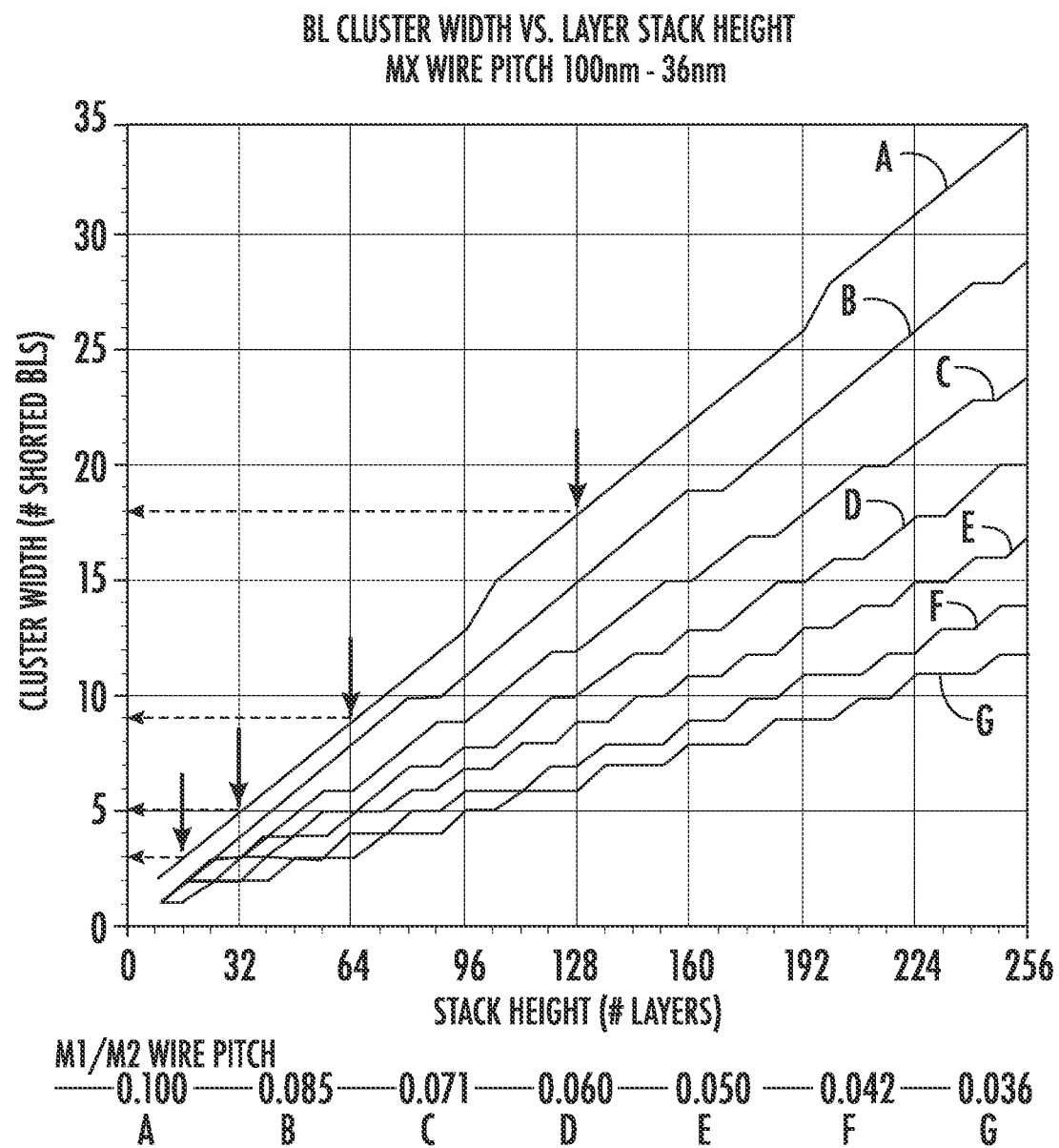
FIG. 2B shows a chart of a bit line cluster width versus layer stack height with different metal line widths.

Hence some balance must be achieved between size and performance. Some exemplary calculations for different bit line clusters are:

16 layers: 3 shorted bit lines, 384 cells per bit line, 6 Kb in cluster 32 layers: 5 shorted bit lines, 640 cells per bit line, 20 Kb in cluster 64 layers: 9 shorted bit lines, 1152 cells per bit line, 72 Kb in cluster 128 layers: 18 shorted bit lines, 2304 cells per bit line, 288 Kb in cluster One conclusion is that bit line clusters with a larger number of layers, i.e., increasing the 3D array stack height, result in bit lines with long lengths with associated large capacitances which raise speed and power issues. Some of these issues may be mitigated by changes to the wire (M1/M2) track pitches. FIG. 2B shows different plots of bit line cluster width versus layer stack height with various M1/M2 wire pitches.

These factors provide guidance for the design of a larger memory unit. A memory array tile, or MAT, is a self-contained array with its own word line and bit line decoding and sense amplifier circuits. A MAT is replicated in some arrangement to create the memory device. Each memory implementation results in some maximum physical array that can be built in order to guarantee a manufacturable memory that is fast and reliable.

According to the present invention, multiple bit line clusters can be combined in the row direction to form MATs. The I/O width is defined by the number of layers in the bit line clusters. The number of bit line clusters in a row equals the MAT word size divided by the cluster I/O width. For example, if the MAT word size is 512 bits and the number of layers in a cluster is 64, 8 bit line clusters are required in row for the MAT.

Figure 3:
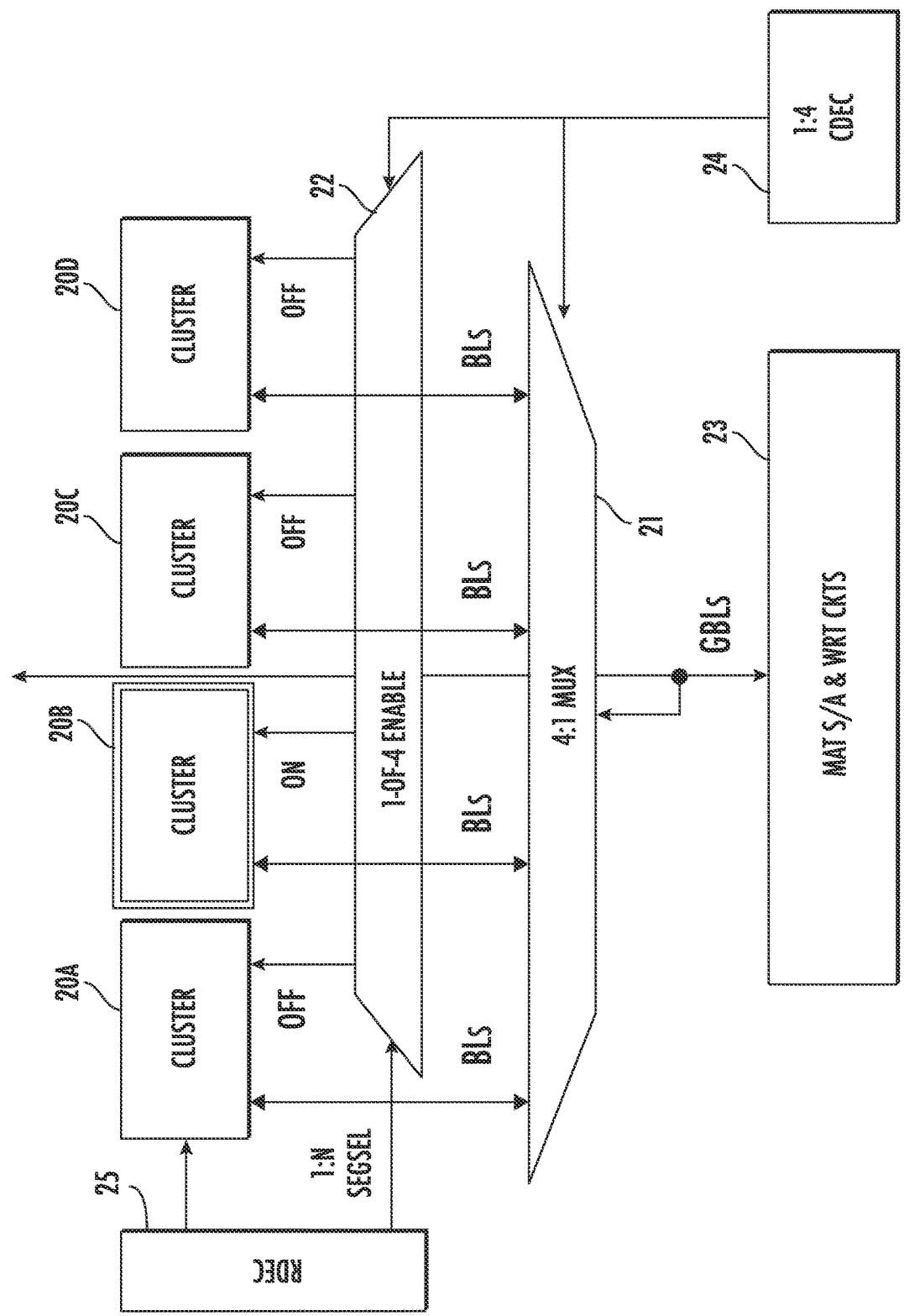
FIG. 3 shows a column multiplexer architecture using bit line clusters in a 3D thyristor memory cell array according to an embodiment of the present invention.

With the disclosed bit line cluster, memory array efficiency can be improved. The bit line clusters can be combined with bit line column selection to increase row lengths efficiently. An example of a MAT with the bit line clusters is illustrated in FIG. 3. The MAT has 4 bit line clusters 20A-20D having their bit lines connected through a multiplexer (and demultiplexer) 21 to global bit lines GBLs which are also connected to other clusters. The global bit lines are also connected to a MAT sense amplifier and write circuit block 23. The bit lines and the global bit lines move data between the bit line clusters and the MAT sense amplifier and write circuit block 23. To select the memory cells from which and to which the bits are read and written, control signals from a row decoder block 25 selects the word lines in the bit line cluster 20A-20D and the segments through a 1-to-4 enable multiplexer 22. The enable multiplexer 22 also receives control signals from a 1:4 column decoder block 24 which selects the particular cluster 20A-20D for the operation.

When a column is selected (the bit line cluster 20B is selected in the FIG. 3), the signals on the segment select lines SG of the other 3 of 4 clusters disable the clusters 20A, 20C and 20D. The bit lines are set to a low supply voltage $V_{SS}$ and the word lines are not enabled. There is no word line or bit line activity in these clusters and hence there are no disturb effects and power consumption in the non-selected clusters. The selected bit line cluster 20B is connected to the global bit lines GBLs and the MAT sense amplifier and write circuit block 23. Read and Write operations can be performed on the selected cluster 20B with the word size defined by the number of layers in bit line clusters. The result is that this arrangement can operate with minimal disturb effects upon the non-selected cells. No special voltage pulses are required to maintain the data in the non-selected cells and no power is consumed.

It should further be noted that the MAT includes more bit line clusters than the ones (20A-20D) shown in FIG. 3. The global bit lines connected to the sense amplifier and write circuit block 23 provide connections to more bit line clusters as indicated by the upward pointing arrow at the end of the global bit lines.

Hence from a small 3D array of thyristor memory cells, the present invention provides for a 3D memory architecture. The described MAT can be adapted to the parameters of the particular technology, present and future.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A memory array tile (MAT) for thyristor memory cells in an integrated circuit comprising:
 a plurality of 3-dimensional thyristor memory cell arrays, each 3-dimensional array having:
  a plurality of thyristor memory cells arranged in a set of parallel planes, each thyristor memory cell having first and second terminals aligned in the plane of the memory cell;
  a plurality of first conducting lines, each first conducting line connected to the first terminals of the thyristor memory cells in one of the set of planes;
  a plurality of second conducting lines, each second conducting line connected to a second terminal of a thyristor memory cell in each one of the planes; each of the plurality of second conducting lines has a first transistor connected to one of the third conducting lines and a second transistor connected to a voltage source for maintaining information stored in each of the plurality of thyristor memory cells;
  a plurality of third conducting lines, each third conducting line controllably connected to a subset of second conducting lines;
  each of the plurality of second conducting lines has a first transistor connected to one of the third conducting lines and a second transistor connected to a voltage source for maintaining information stored in each of the plurality of thyristor memory cells;
 sense amplifiers and write circuits;
 a multiplexer/demultiplexer connected to the first conducting lines of each of the plurality of 3-dimensional thyristor memory cell arrays, the multiplexer/demultiplexer selectively connecting the sense amplifiers and write circuits to one of the plurality of 3-dimensional thyristor memory cell arrays during read or write operations; and
 control circuits selectively connecting the one of the plurality of 3-dimensional thyristor memory cell arrays to the sense amplifiers and write circuits.

2. The memory array tile of claim 1 wherein the first transistor is located at a first end and the second transistor at a second end of each of the plurality of second conducting lines.

3. The memory array tile of claim 1 wherein the second transistor comprises an MOS transistor which is weakly on to connect the voltage source to the corresponding second conducting line.

4. The memory array tile of claim 3 wherein the second transistor comprises a PMOS transistor.

5. The memory array tile of claim 1 wherein in the selective connection of the one of the plurality of 3-dimensional thyristor memory cell arrays to the sense amplifiers and write circuits, the control circuits connect one of the plurality of third conducting lines in the selectively connected one of the plurality of 3-dimensional thyristor memory cell arrays, and disconnect a remainder of the plurality of third conducting lines in the selectively connected one of 3-dimensional thyristor memory cell arrays.

6. The memory array tile of claim 5 wherein all of the plurality of second conducting lines in a 3-dimensional thyristor memory cell array not selectively connected by control circuits are connected to a voltage source to maintain thyristor memory cells connected to the plurality of second conducting lines in standby.

7. The memory array tile of claim 6 wherein each of the plurality of second conducting lines is connected to the voltage source by an MOS transistor which is weakly on.

8. The memory array tile of claim 7 wherein the MOS transistor comprises a PMOS transistor.

9. The memory array tile (MAT) of claim 1 wherein the number of first conducting lines comprises a number of bits of an Input/Output word of the memory array tile.

10. An integrated circuit having a memory comprising:
 a plurality of memory array tiles (MATs), each memory array tile (MATs) further comprising:
  a plurality of 3-dimensional thyristor memory cell arrays, each 3-dimensional array having:
   a plurality of thyristor memory cells arranged in a set of planes parallel to a surface of a semiconductor substrate, each thyristor memory cell having first and second terminals;
   a plurality of first conducting lines, each first conducting line connected to the first terminals of the thyristor memory cells in one of the set of planes;
   a plurality of second (segment) conducting lines, each second conducting line connected to a second terminal of a thyristor memory cell in each one of the planes;
   a plurality of third conducting lines, each third conducting line controllably connected to a subset of second conducting lines;
   each of the plurality of second conducting lines has a first transistor connected to one of the third conducting lines and a second transistor connected to a voltage source for maintaining information stored in each of the plurality of thyristor memory cells;
  sense amplifiers and write circuits; and
  a multiplexer/demultiplexer connected to the first conducting lines of each of the plurality of 3-dimensional thyristor memory cell arrays, the multiplexer/demultiplexer selectively connecting the sense amplifiers and write circuits to one of the plurality of 3-dimensional thyristor memory cell arrays during read or write operations.

11. The memory array tile of claim 10 wherein the first transistor is located at a first end and the second transistor at a second end of each of the plurality of second conducting lines.

12. The memory array tile of claim 10 wherein the second transistor comprises an MOS transistor which is weakly on to connect the voltage source to the corresponding second conducting line.

13. The memory array tile of claim 12 wherein the second transistor comprises a PMOS transistor.

14. The integrated circuit of claim 10 wherein each memory array tile (MAT) further comprises:
control circuits selectively connecting the one of the plurality of 3-dimensional thyristor memory cell arrays to the sense amplifiers and write circuits.

15. The integrated circuit of claim 10 wherein the number of first conducting lines comprises a number of bits of an Input/Output word of the memory array tile.

16. The integrated circuit of claim 10 wherein each memory array tile (MAT) further comprises:
a second plurality of 3-dimensional thyristor memory cell arrays, each 3-dimensional array having:
  a second plurality of thyristor memory cells arranged in the set of planes, each thyristor memory cell having first and second terminals;
  a second plurality of first conducting lines, each first conducting line connected to the first terminals of the thyristor memory cells in one of the set of planes;
  a second plurality of second conducting lines, each second conducting line connected to a second terminal of a thyristor memory cell in each one of the planes;
  a second plurality of third conducting lines, each third conducting line controllably connected to a subset of second conducting lines;
  each of the second plurality of second conducting lines has a first transistor connected to one of the third conducting lines of the second plurality of second conduting lines and a second transistor connected to a voltage source for maintaining information stored in each of the second plurality of thyristor memory cells; and
wherein the multiplexer/demultiplexer is connected to the first conducting lines of each of the second plurality of 3-dimensional thyristor memory cell arrays, the multiplexer/demultiplexer selectively connecting the sense amplifiers and write circuits to one of the second plurality of 3-dimensional thyristor memory cell arrays during read or write.

* * * * *